(12) United States Patent
Nanba (10) Patent No.: US 7,274,610 B2
(45) Date of Patent: Sep. 25, 2007

(54) SEMICONDUCTOR MEMORY DEVICE (75) Inventor: Yasuhiro Nanba, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/419,261

(22) Filed: May 19, 2006

(65) Prior Publication Data

US 2006/0291299 A1 Dec. 28, 2006

(30) Foreign Application Priority Data

May 20, 2005 (JP) ............................. 2005-148302

(51) Int. Cl.
*G11C 7/00* (2006.01)

(52) U.S. Cl. .................. 365/201; 365/189.07
(58) Field of Classification Search ................ 365/201, 365/189.07; 714/704, 719
See application file for complete search history.

(56) References Cited

U.S. PATENT DOCUMENTS

| 5,777,932 A | 7/1998 | Chonan |
| 5,914,964 A * | 6/1999 | Saito et al. .................. 714/704 |
| 5,925,142 A * | 7/1999 | Raad et al. ................... 714/719 |
| 6,317,368 B1 * | 11/2001 | Taito et al. ............ 365/189.11 |
| 6,550,026 B1 * | 4/2003 | Wright et al. ................ 714/719 |
| 6,967,878 B2 | 11/2005 | Dono |
| 2004/0213056 A1 | 10/2004 | Fujima |

FOREIGN PATENT DOCUMENTS

| JP | 09-128998 | 5/1997 |
| JP | 2003-257194 | 9/2003 |
| JP | 2004-039123 | 2/2004 |
| JP | 2004-303354 | 10/2004 |

\* cited by examiner

*Primary Examiner*—Vu A. Le
(74) *Attorney, Agent, or Firm*—Whitham Curtis Christofferson & Cook, PC (57) ABSTRACT

Disclosed is a semiconductor memory device equipped with an on-chip comparison and latching function, including a latch circuit which receives a comparison result signal, output from a compare circuit receiving read data signals from plural data bus signals and an input data signal from outside and comparing whether or not the signals coincide with each other, to output the result of latching of the fail information based on a control signal. The latch circuit latches and outputs the fail information of a preset number bit output from the compare circuit during the time when a control signal for latching and outputting the fail information is in active state.

9 Claims, 9 Drawing Sheets

SEMICONDUCTOR MEMORY DEVICE

FIELD OF THE INVENTION

This invention relates to a semiconductor memory device and, more particularly, to a semiconductor memory device applied to advantage to an on-chip compare test circuit and to an antifuse technique, such as a capacitance fuse technique.

BACKGROUND OF THE INVENTION

An antifuse which allows for redundancy swapping, that is, replacing a fail cell with a redundant cell, in a packaged state of a chip, has come to be used in recent years. A capacitance fuse is a sort of antifuse in which a capacitor structure is formed in an antifuse material. With the capacitance fuse, if high voltage is applied across an upper electrode and a lower electrode of a capacitor, a dielectric film between the two electrodes undergoes insulation breakdown so that a conducting path is formed between the two electrodes. The address information on the fail cell may be written even after mounting a chip into a package and may be used for remedying the hold deterioration fail of a memory cell even after the assembly and packaging. The antifuse is ordinarily used for remedying smaller numbers of bits because the chip area increases with increase in the number of antifuses in use. As for a redundancy circuit employing an antifuse, reference is made to Patent Document 1, as an example.

The smaller numbers of fail bits, that can be remedied by the antifuses, are detected based on checked results of the fail information on the tester side. In case the check on the tester side is not possible, the capacitance fuses are connected to all defective products before conducting check for fails.

The on-chip comparison function latches the first bit fail due to its circuit configuration. Thus, in case a semiconductor memory device is equipped with such on-chip comparison function, it is impossible to detect a chip that allows for replacement by an anti-fuse, such as a capacitance fuse.

Figure 6:
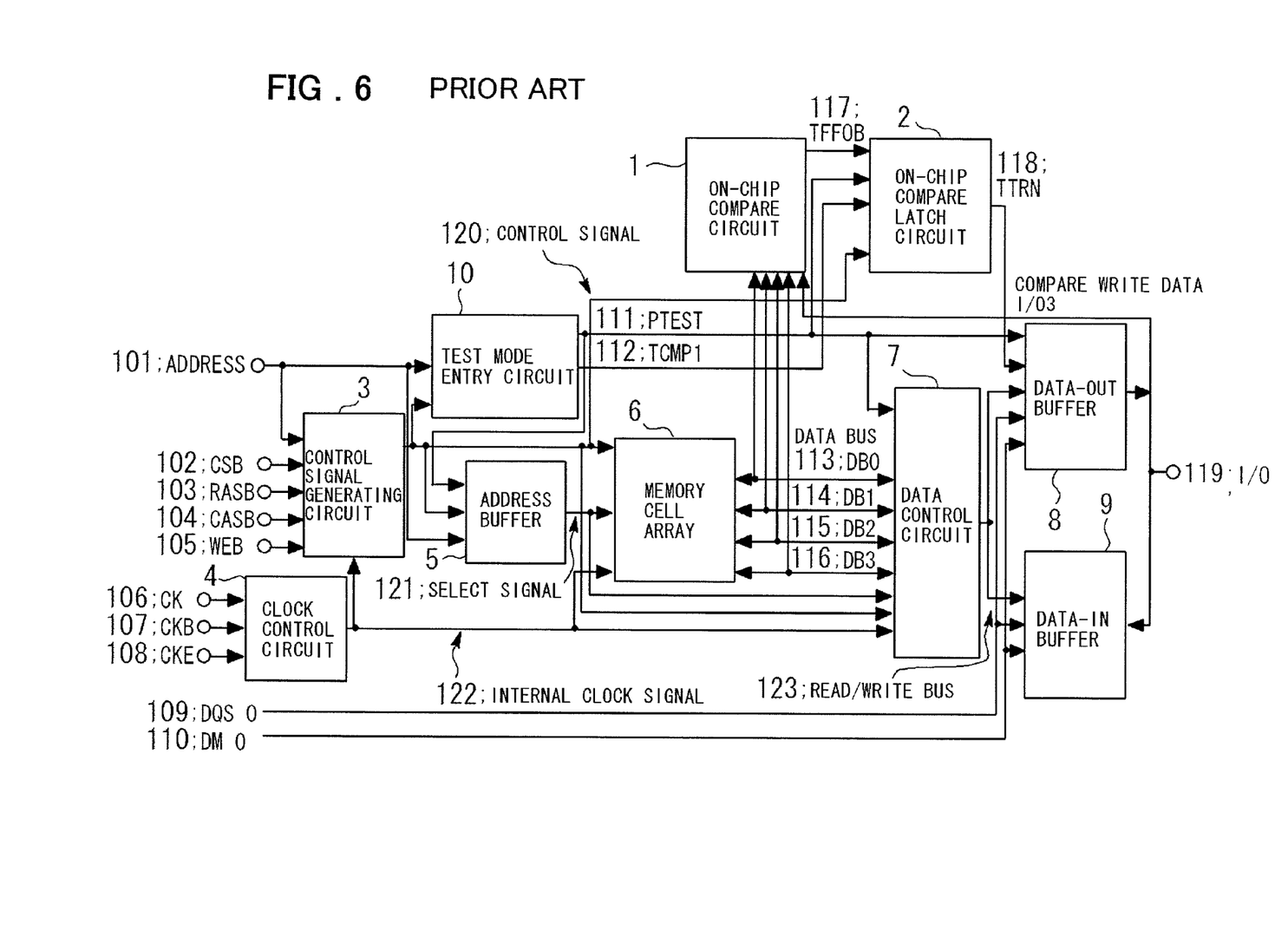
FIG. 6 is a diagram showing a conventional semiconductor memory device.

FIG. 6 is a block diagram showing a typical illustrative configuration of a semiconductor memory device adopting a double data rate (DDR). This conventional semiconductor memory device includes a clock control circuit 4, a control signal generating circuit 3, an address buffer 5, a memory cell array 6, a data control circuit 7, a data-out buffer 8, a data-in buffer 9, a test mode entry circuit 10, an on-chip compare circuit 1 and an on-chip compare latch circuit 2.

The control signal generating circuit 3 receives an address signal 101, a CSB (chip select) signal 102, an RASB (row address strobe) signal 103, a CASB (column address strobe) signal 104, a WEB (write enable) signal 105 and an internal clock signal 122, and outputs a control signal 120. Meanwhile, the upper case letter B affixed to the ends of respective signal names, namely CSB, RASB, CASB and WEB, indicates that the signals are active at a low level (low-active signal).

The control signal 120 is supplied to the address buffer 5, memory cell array 6, data control circuit 7, test mode entry circuit 10 and to the on-chip compare latch circuit 2.

The clock control circuit 4 receives clock signals, namely a CK signal 106 and CKB signal (a complementary signal of CK) 107, and a CKE signal 108, which is a clock enable signal, to generate an internal clock signal 122, which is supplied to the control signal generating circuit 3, memory cell array 6 and to the data control circuit 7.

The test mode entry circuit 10 receives the address signal 101 and control signal 120 to output a PTEST signal 111 and a TCMP1 signal 112.

The address buffer 5 receives the address signal 101, control signal 120 and PTEST signal 111 to output a select signal 121 to the memory cell array 6.

The memory cell array 6 receives the control signal 120, select signal 121 and internal clock signal 122 to output data bus signals DB0 to DB3 (113 to 116). Although FIG. 6 shows four data buses, for simplicity, the number of the data buses is, of course, not restricted to four.

The data control circuit 7 receives the data bus signals DB0 to DB3 (113 to 116), PTEST signal 111, select signal 121, control signal 120 and internal clock signal 122 to output a read/write bus signal 123.

The on-chip compare circuit 1 receives the data bus signals DB0 to DB3 (113 to 116) and an input data signal from an external I/O terminal 119 to output a TFF0B signal 117.

The on-chip compare latch circuit 2 receives the TFF0B signal 117, PTEST signal 111, TCOM signal 112 and the control signal 120 to output a TTRN signal 118.

The data-out buffer 8 receives the read/write bus signal 123, TTRN signal 118, DQS signal 109 and DM signal 110 to output data at the external I/O 119.

The data-in buffer 9 receives data from the I/O 119, while also receiving the DQS signal 109 and DM signal 110 to output data on the read/write bus 123.

The operation of the semiconductor memory device of FIG. 6 will now be described. Initially, the operation of reading/writing data without employing a test mode circuit system (normal operation) will be described.

The address signal 101 is held in the address buffer 5. Based on the select signal 121, held in the address buffer, a word line and a bit line in the memory cell array 6 are selected. For a read operation, memory cell data, selected in this manner, are output to the data buses DB0 to DB3 (113 to 116) and thence to the read/write bus 123 via data control circuit 7. Hence, data is read out from the data-out buffer 8 via external I/O 119.

The operation for writing data entered to the data-in buffer 9 from the I/O 11 occurs in a reverse sequence to that for reading out the data. That is, input data on the read/write bus 123 is supplied via data control circuit 7 to the data buses DB0 to DB3 (113 to 116) and written in selected memory cells in the memory cell array 6.

The operation for the on-chip compare test mode will now be described with reference to FIGS. 6 to 9.

The on-chip compare test mode is one of test modes carried out in a screening process. The read data read from a memory cell in the chip is compared with write data supplied from the external I/O (expected value) and the non-coincidence information (fail information) is latched. After completion of the test, latched data is read out once and checked.

In a large-size parallel tester, such as a TBT(tester burn-in test) equipment used in a screening process, in which there is imposed a limitation on the number of device-side comparators, all-chip test is not completed except if the same test is carried out a preset number of times. Thus, if the device-side comparators are not used during test, the entire chips may be tested simultaneously, so that test time may be reduced to that for only one testing. It is sufficient that testing is carried out in the on-chip comparison test mode and that the latch information for each chip is read only once and for all. This leads to marked reduction in the test time.

Figure 7:
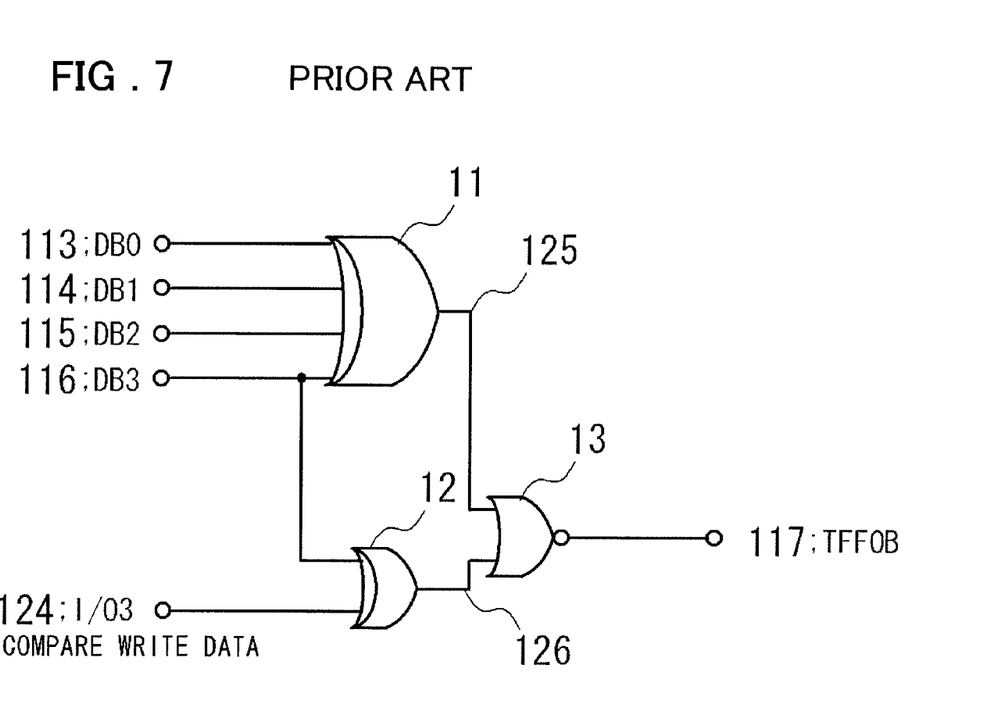
FIG. 7 is a diagram showing the configuration of a conventional on-chip compare circuit.

The circuit operation of the on-chip comparison test will now be described. FIG. 7 is a diagram showing an illustrative configuration of the on-chip compare circuit 1 of FIG. 6. The on-chip compare circuit includes a four-input EXOR (exclusive-OR) circuit 11, receiving data bus signals DB0 to DB3 (113 to 116) as inputs, a two-input EXOR circuit 12, receiving compare write data and DB3 as inputs, and a NOR circuit 13, receiving outputs of the EXOR circuits 11, 12 as inputs.

A signal line 125, as an output of the EXOR (exclusive-OR) circuit 11, goes LOW only when the entire data of the data bus signals DB0 to DB3 (113 to 116) of the memory cell array information, read out from the memory cell array 6, are coincident with one another. A signal line 126, which is an output of the EXOR 12, goes LOW only when data 124, assumed herein to be DB3, from a sole I/O pin, assumed herein to be I/O3, out of write data applied at this time to the I/O 119, and one of the data bus signals DB0 to DB3 (113 to 116), are coincident with each other. The TFF0B signal 117 is output from a NOR circuit 13 which receives the signals 125, 126. That is, the TFF0B signal 117 becomes HIGH only when the data bus signals and the compare write data are all coincident. If any of the data bus signals and the compare write data is non-coincident, the TFF0B signal 117 becomes LOW. The internal fail information becomes data on the TFF0B signal line 117.

Figure 8:
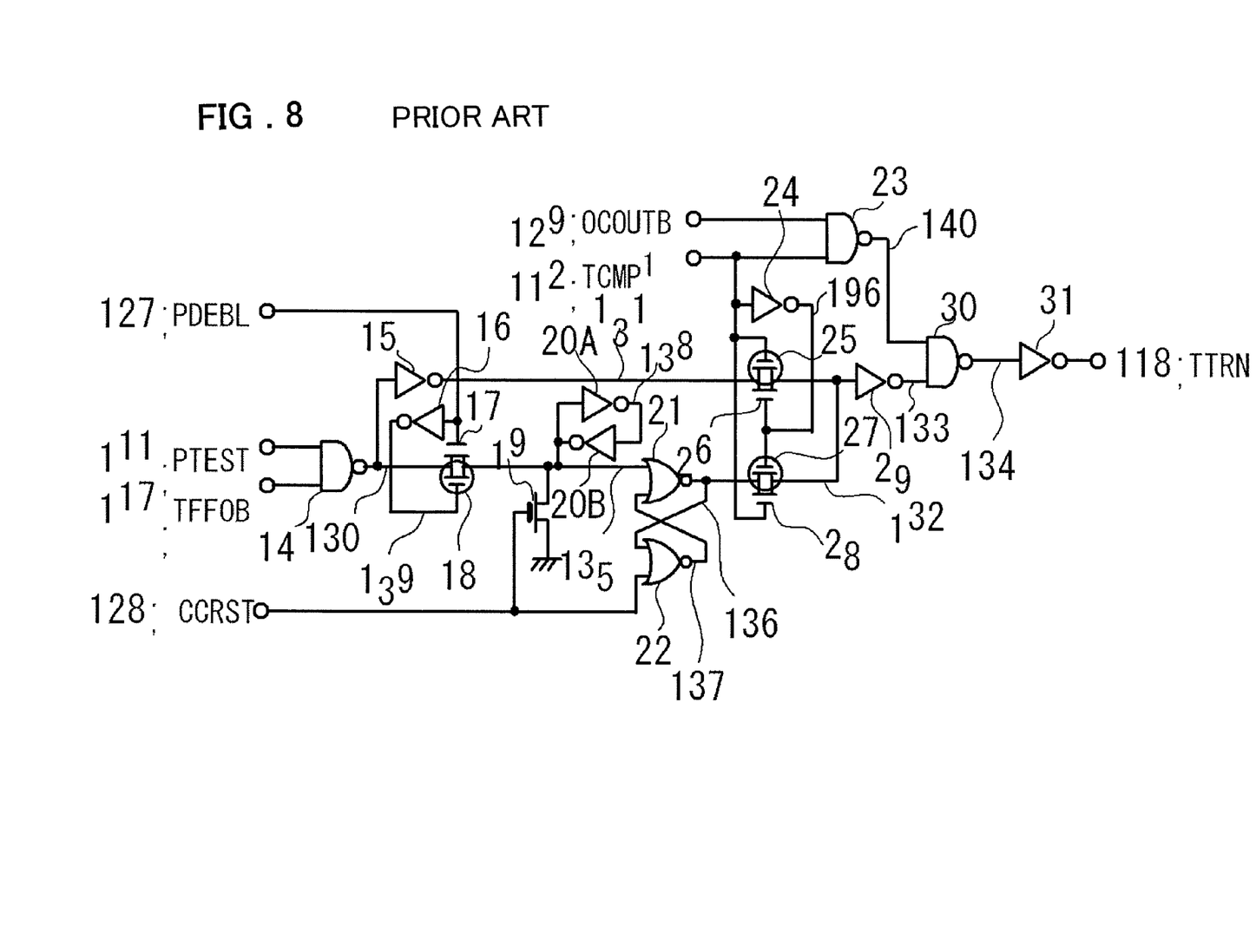
FIG. 8 is a diagram showing the configuration of a conventional on-chip compare latch circuit.

FIG. 8 is a diagram showing an illustrative configuration of the on-chip compare latch circuit 2. This on-chip compare latch circuit 2 outputs data as it is on the TFF0B signal line 117 or outputs data which is the latched LOW level information of the TFF0B signal 117 which has indicated a failed state if only once.

The operation of a PDEBL signal 127, an OCCRST signal 128 and an OCOUTB signal 129 of FIG. 8, which are the control signals 120 output from the control signal generating circuit 3 of FIG. 6 and generated with a test mode entry signal, and the PTEST signal 111 and the TCMP1 signal 112, which are test mode signals, output from the test mode entry circuit 10 of FIG. 6, will now be described.

The test mode signal is used for screening and evaluation of the device but is not used on the part of the user of the device. Hence, the test mode signal is entered with a specified timing and address. This entry is made by the test mode entry circuit 10.

The PTEST signal 111 controls the test mode called 'parallel test mode'. Since bit-by-bit based testing of the memory cell array is time-consuming, plural addresses are compressed and plural items of data are read or written in parallel.

The TCMP1 signal 112 is a test mode signal used for latching and outputting the fail information obtained by on-chip comparison. The TCMP1 signal 112 is used simultaneously with the PTEST signal 111.

The PDBEL signal 127 is a latch gate signal.

The OCCRST signal 128 is a signal for initializing the latch information.

The OCOUTB signal 129 is a signal for enabling the data information to be latched in the on-chip comparison and output to the data-out circuit.

Referring to FIG. 8, the on-chip compare latch circuit 2 is divided into a path which uses as it is, an output signal 130 of a NAND circuit 14 which receives the PTEST signal 111 and TFF0B signal 117, and a path which latches and outputs the first LOW level information of the TFF0B signal 117.

The path which uses the signal 130 as it is, is supplied to the gate of an inverter 15 to output a signal 131. The signal 131 connected to a signal 132 via a transfer gate made up of a P-channel MOS transistor 25 and an N-channel MOS transistor 26. The gate of the P-channel MOS transistor 25 is supplied with the TCMP1 signal 112. The gate of the N-channel MOS transistor 26 is supplied with a signal 196 output from the inverter 24 which inverts the TCMP1 signal 112. An inverter 129 inverts the signal 132 to output a signal 133.

A NAND circuit 23 receives as inputs, the OCOUTB signal 129 and TCMP1 signal 112 to output a signal 140.

A NAND circuit 30 receives the signals 140 and 133 to output a signal 134. An inverter 31 receives and inverts the signal 134 to output the TTRN signal 118.

The path which latches and outputs the first LOW level information (fail information) of the TFF0B signal 117 is connected to a signal 135 via a transfer gate made up of an N-channel transistor 17 and a P-channel transistor 18. The gate of the N-channel transistor 17 is supplied with the PDEBL signal 127, while the gate of the P-channel transistor 18 is supplied with a signal 139 obtained on inverting the PDEBL signal 127 by an inverter 16.

There is provided a latch circuit composed of inverters 20A and 20B. The inverters 20A and 20B operate in such a manner that the signal 135 is supplied to and inverted by the inverter 20A so as to be output as a signal 138, which is supplied to and inverted by the inverter 20B so as to be connected to the signal 135.

The signal 135 is supplied to one input of a NOR circuit 21, which NOR circuit 21 outputs a signal 136. The signal 136 is supplied to one input of a NOR circuit 22, the other input of which receives the OCCRST signal 128. The NOR circuit 22 outputs a signal 137, which is supplied to the other input of the NOR circuit 21.

An N-channel transistor 19 which has a gate supplied with the OCCRST signal 128, is connected between the signal line 135 and the ground.

The signal 136 is connected to the signal 132 via a transfer gate made up by an NMOS transistor 28 and a P-channel MOS transistor 27. The gate of the NMOS transistor 28 is supplied with the TCOM1 signal 112, while the gate of the P-channel MOS transistor 27 is supplied with the signal 196 obtained on inverting the TCOM1 signal 112 by the inverter 24.

The TTRN signal 118, as an output signal of the on-chip compare latch circuit 2, is supplied to one of data-out buffers 8 in FIG. 6, herein a data-out buffer, associated with the compare write data I/0 3, and is read to outside via one of the I/Os 119, herein an I/O3.

Figure 9:
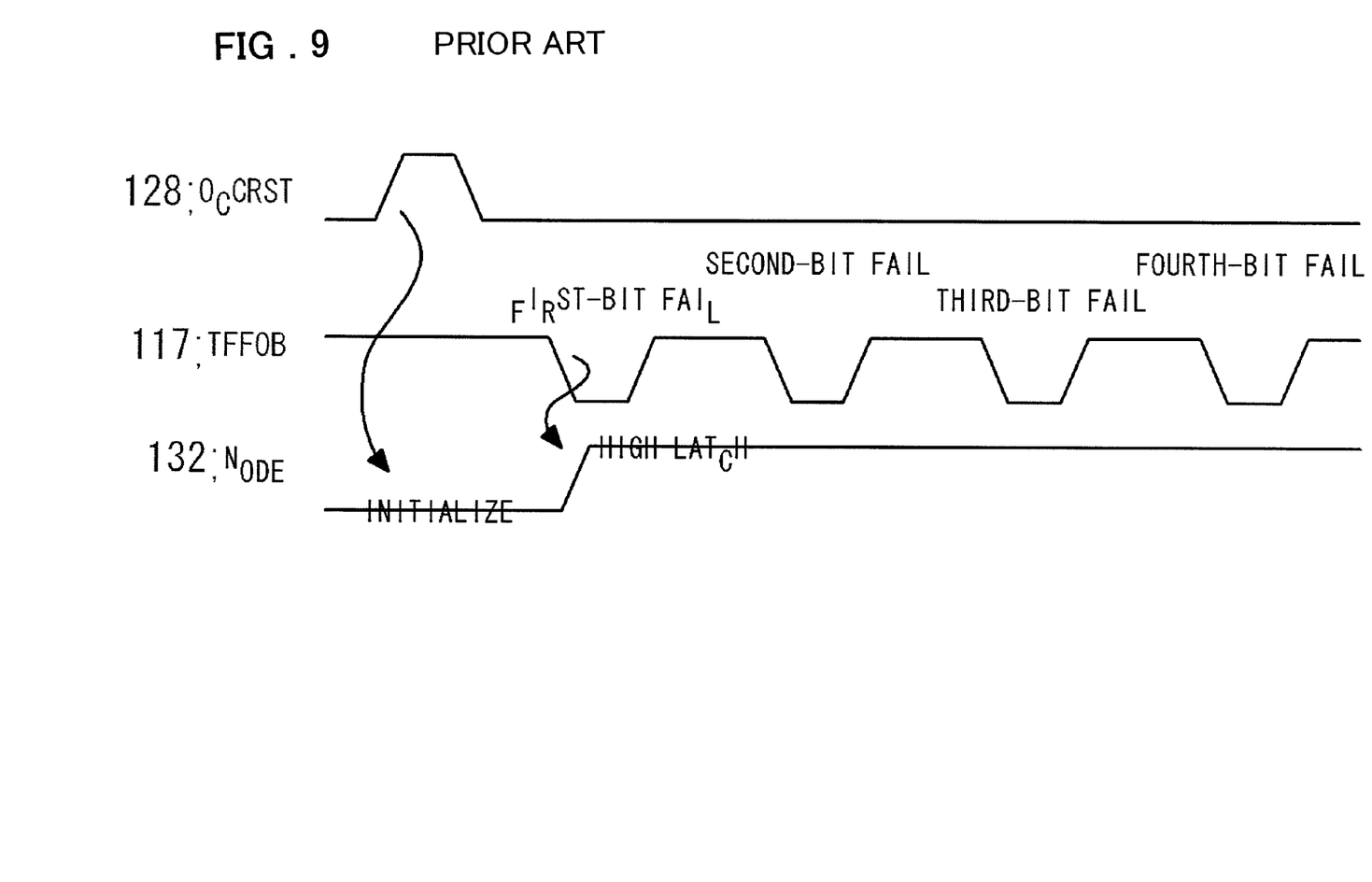
FIG. 9 is a timing chart showing the operation of the conventional on-chip compare latch circuit.

The circuit operation will now be described by referring to a timing chart of FIG. 9. The respective test modes are activated by the entry of the test mode, mentioned above, to initiate a sequence of operations.

Each inner node point is initialized by a one-shot pulse (HIGH level) of the OCCRST signal 128. The N-channel MOS transistor 19 is turned on so that the signal 135 goes LOW. The output 127 of the NOR circuit 22 goes LOW so that the output of the NOR circuit 21 goes HIGH.

The OCCRST signal 128 goes LOW after initialization with the OCCRST signal 128 being a HIGH-level one-shot pulse. The N-channel MOS transistor 19 is turned off (in the floating state), with the input of the NOR circuit 22 becoming LOW.

The PTEST signal 111 then goes HIGH, whereby the TFF0B signal 117, which is the result of comparison between read data and an expected value externally supplied, is sent via NAND circuit 14 to the signal line 130.

The PDEBL signal 127 goes HIGH to turn on the transistors 17 and 18, so that connection is made to the path which latches and outputs the first LOW level of the TFF0B signal 117.

The signal 135 is LOW in the initial state, so that, when the TFF0B signal 117 becomes LOW, indicating data non-coincidence, the signals 130 and 135 become HIGH, with the output 136 of the NOR circuit 121 going LOW. Since the signal 137 then goes HIGH, the signal 136 of the flip-flop circuit, composed of the NOR circuits 21 and 22, remains fixed at the LOW level, irrespective of the information of the TFF0B signal 117.

After termination of a sequence of internal latch test operations, the TCOM1 signal 112 becomes HIGH by the test mode. The transfer gate (27, 28) is turned on, and the signal 132 becomes the result of the signal 136 which has latched the initial LOW level information of the TFF0B signal 117. The TTRN signal 118 is set to the LOW level.

With the OCOUTB signal 129 then going LOW, the result of the signal 132 is output to the TTRN signal line 118 via inverter 29, NAND 30 and inverter 31.

In case of data non-coincidence, the TTRN signal 118 is HIGH. The data of this TTRN signal 118 is read out to outside from one of the I/Os 119, for example, I/O 3, via data-out buffer 8.

The circuit operation for the path for outputting the data which has latched the initial fail information on the TFF0B signal line 117 has been described in the foregoing. The circuit operation for the other path for directly outputting the data of the TFF0B signal line 117 is simply that, if the TCMP1 signal 112 is LOW, the transfer gates 25, 26 is in the on-state, and hence the data of the signal 130 becomes the signal 131 via inverter 15, while becoming the signal 132 via transfer gate 25, 26, and becoming the signal 133 via inverter 29.

Since the TCMP1 signal 112 is LOW, the output 140 of the NAND circuit 23 becomes HIGH. The data on the signal line 133 becomes the signal 134 via NAND circuit 30, and further becomes the TTRN signal 118 via inverter 31. Thus, in the path under consideration, the TTRN signal 118 becomes an output of the bit-by-bit internal non-coincidence fail information. It is noted that the signal level becomes HIGH in case of non-coincidence.

As for the on-chip comparison test, reference may be made to the following Patent Documents 2 to 4.

[Patent Document 1] JP Patent Kokai Publication No. JP-P2004-303354A

[Patent Document 2] JP Patent Kokai Publication No. JP-P2004-39123A

[Patent Document 3] JP Patent Kokai Publication No. JP-P2003-257194A

[Patent Document 4] JP Patent Kokai Publication No. JP-A-9-128998

SUMMARY OF THE DISCLOSURE

Among the antifuses for internally replacing a fail bit after assembling a chip in a package, there is a capacitance fuse which adopts a capacitor structure. For detecting a smaller number of fail bits, that may be remedied by the antifuses, there is no means other than checking fail information on the tester side.

If the check by the tester is not possible, there is no alternative but to connect the antifuses to all defective items to then check for possible fail.

Moreover, in the above-described on-chip comparison function, the circuit configuration is such that fail of the first bit is latched for all time. It is therefore not possible to detect a chip that may allow for replacement by an antifuse, such a as capacitance fuse.

Accordingly, it is an object of the present invention to provide a semiconductor memory device having the on-chip comparison function, which enables latching a fail bit or bits other than the first bit.

The above and other objects are attained by a semiconductor memory device according to the present invention comprising: a compare circuit, receiving a plurality of read data signals read from a cell array and an input data signal externally supplied to the semiconductor memory device in association with said read data signals, for comparing said read data signals with said input data signal to each other to output a comparison result signal; and a latch circuit, receiving said comparison result signal output from said compare circuit, for outputting the result of latching of a fail bit of a predetermined number succeeding to a first fail bit.

According to the present invention, the latch circuit receives a first control signal controlling the latching and outputting of the fail information and, in case the first control signal is in inactive state, the latch circuit outputs, as it is, the comparison result signal output from the compare circuit.

According to the present invention, the latch circuit includes a circuit for receiving a second control signal and for selecting whether or not the first fail bit is to be latched or the N'th fail bit, where N is a preset integer not less than 2, is to be latched, in case the first control signal is in active state, based on the value of the second control signal.

A semiconductor memory device according to the present invention includes: an on-line compare circuit, receiving data signals read out to a plurality of data buses from a cell array and an data signal supplied thereto from outside, for comparing the signals received as to whether or not the signals received coincide with each other to output said comparison result signal; an on-line compare latch circuit for latching fail information of a first fail bit responsive to a comparison result signal from said on-line compare circuit; wherein said on-line compare latch circuit includes: a circuit for latching a fail bit, as from a preset number fail bit succeeding to a first fail bit, based on a first control signal received; and a circuit for selecting one out of outputting said comparison result signal as it is, outputting the latched result of the first fail bit and outputting the latched result of the preset number fail bit succeeding to the first fail bit, based on the first control signal and a second control signal received.

The meritorious effects of the present invention are summarized as follows.

According to the present invention, the function of the on-chip compare circuit is enhanced to latch any of the second and the following fail bits, so that one fail bit devices, that may be remedied by anti-fuses, such as capacitance fuses, may readily be detected, thereby making one fail bit devices good devices.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention.

Accordingly, the drawing and description are to be regarded as illustrative in nature, and not as restrictive.

PREFERRED EMBODIMENTS OF THE INVENTION

Figure 1:
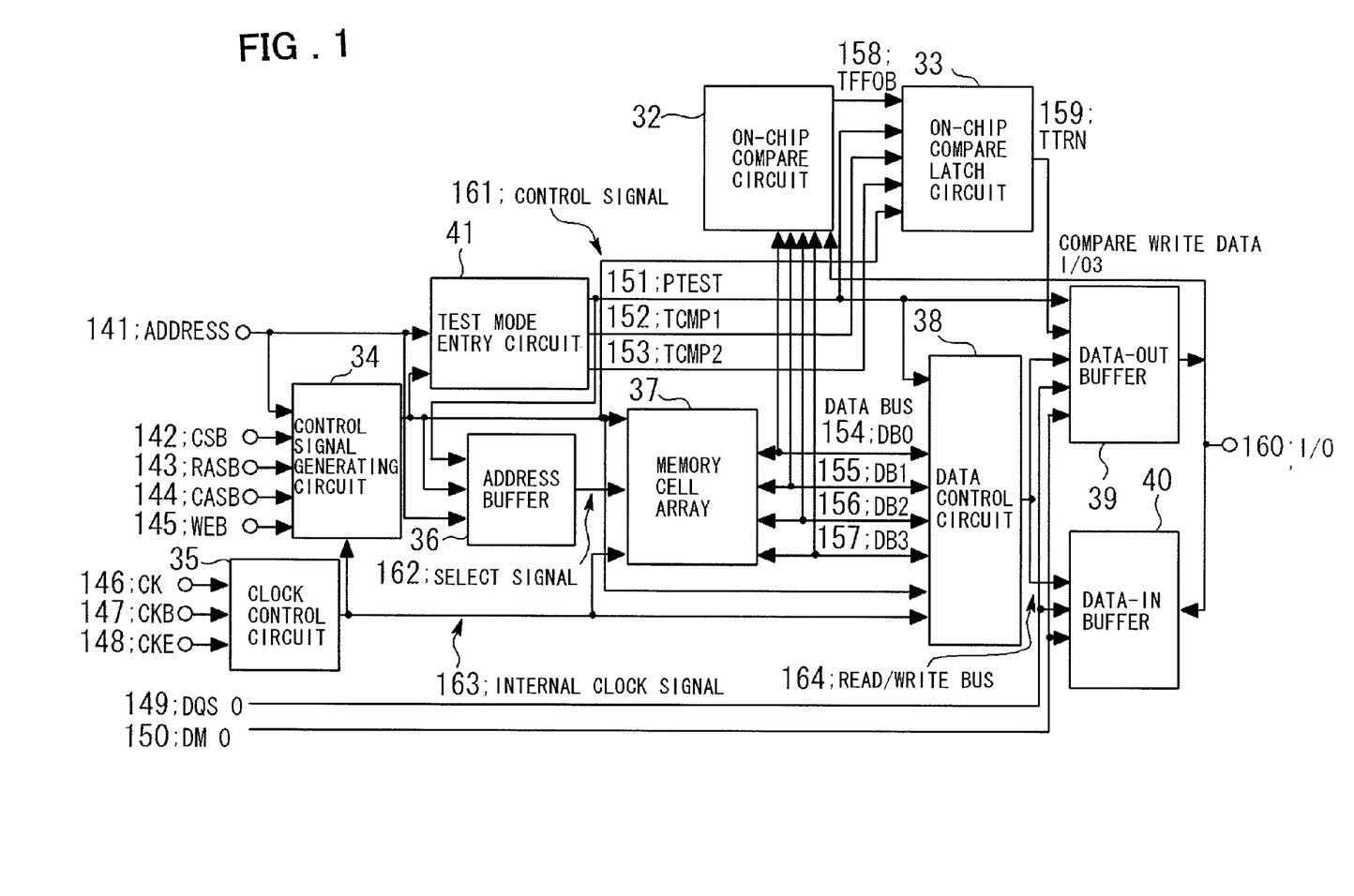
FIG. 1 is a diagram showing the configuration of a semiconductor memory device according to an embodiment of the present invention.
Figure 2:
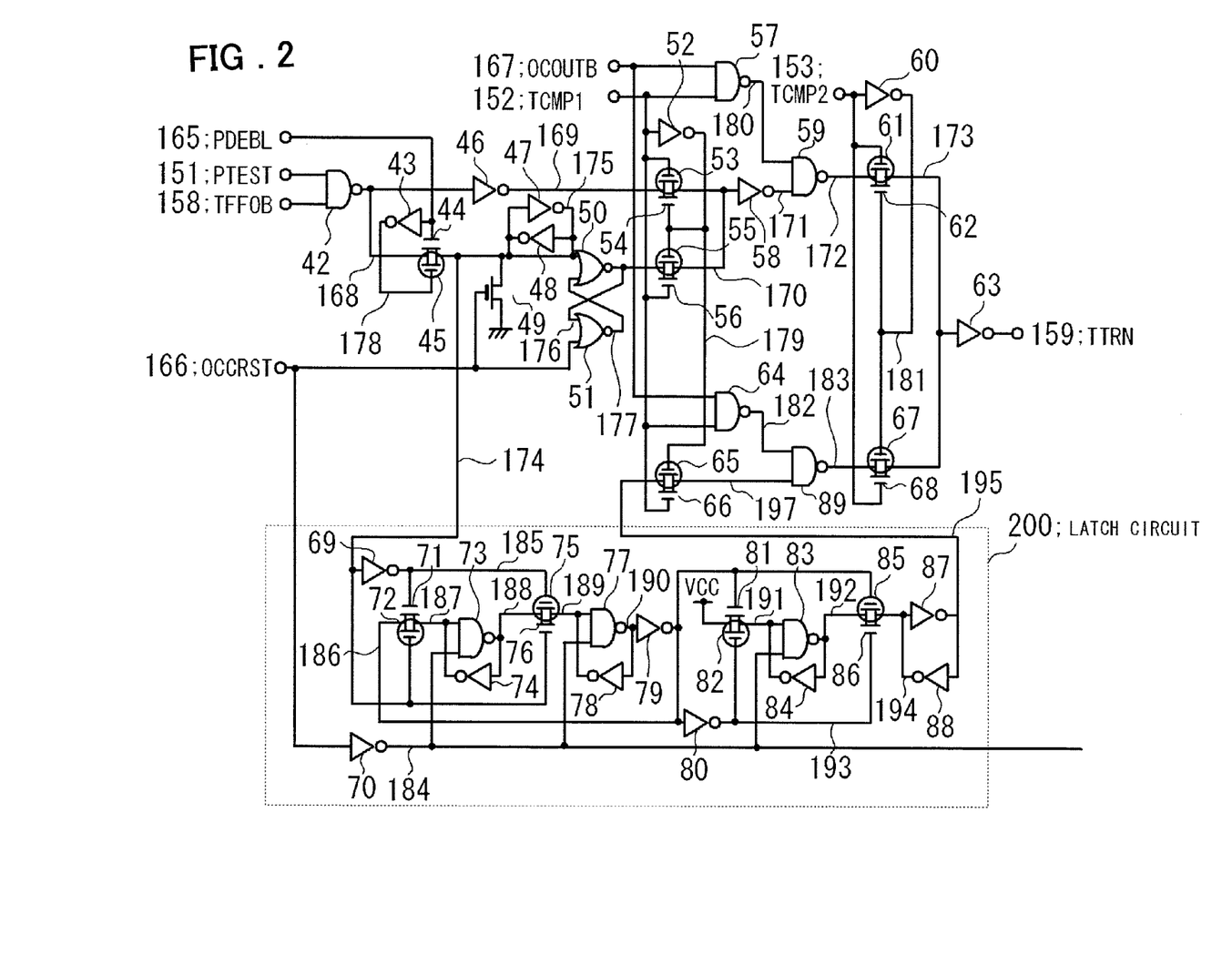
FIG. 2 is a diagram showing the configuration of an on-chip compare latch circuit of the embodiment shown in FIG. 1.

Reference will now be made to the accompanying drawings for further illustration of the present invention. FIG. 1 is a diagram showing the configuration of an embodiment of the present invention. FIG. 2 is a diagram showing the configuration of an on-chip compare circuit 32 shown in FIG. 1. In an embodiment of the present invention, a circuit for latching any fail bit as from the second fail bit, and a test mode signal as well as a test mode circuit for executing the path switching, are added to an on-chip compare latch circuit 33 for latching the one-bit fail information. In more detail, referring to FIG. 2, the on-chip compare latch circuit 33 in FIG. 1 has such a configuration in which there are added a circuit receiving a comparison result signal from the on-chip compare circuit (the on-chip compare circuit corresponding to the on-chip compare circuit shown in FIG. 8) to latch any fail bit as from the second fail bit and a test mode for selecting between these circuits, to an on-chip compare circuit shown in FIG. 8, that is, the configuration of latching the one-bit fail information.

In FIG. 1, the on-chip compare circuit 32 is the same as the on-chip compare circuit 1 of FIG. 6 (see also FIG. 7) and hence the description therefore is dispensed with. A control signal generating circuit 34, a clock control circuit 35, an address buffer 36, a memory cell array 37, a data control circuit 38, a data-out buffer 39 and a data-in buffer 40 are the same as the control signal generating circuit 3, clock control circuit 4, address buffer 5, memory cell array 6, data control circuit 7, data-out buffer 8 and the data-in buffer 9, respectively, and hence the description therefore is also dispensed with. A test mode entry circuit 41 generates and outputs a PTEST signal 151, TCMP1 signal 152 and TCMP2 signal 153. The present embodiment will now be described with reference to FIGS. 1 and 2.

The TCMP2 signal 153 is a test mode signal added to the configuration of FIG. 6. This TCMP2 signal 153 is used for switching the data non-coincidence latch information.

Referring to FIG. 2, a second fail bit latch circuit is added to the configuration of FIG. 8. This second fail bit latch circuit is connected to a signal line 174 which is connected to a signal line 168 via a transfer gate composed by a N-channel MOS transistor 44 and P-channel MOS transistor 45. A transfer gate composed by complementary transistors, for example, 44 and 45 are denoted as transfer gate (44,45) for abbreviation. The N-channel MOS transistor 44 has a gate supplied with the PDEBL signal 165 and the P-channel MOS transistor 45 has a gate supplied with an inverted version of the PDEBL signal 165 output by an inverter 43. The signal 168 is an output of a NAND circuit 42 which receives a TFF0B signal 158 and PTEST signal 151.

In the second fail bit latch circuit, the signal 174 which is the output of the transfer gate (44, 45) is supplied to the gates of a P-channel MOS transistor 72, to the gate of an N-channel MOS transistor 76 and to an inverter 69. An output 185 of the inverter 69 is supplied to the gate of a N-channel MOS transistor 71 and to the gate of a P-channel MOS transistor 75.

A transfer gate composed by a N-channel MOS transistor 71 and P-channel MOS transistor 72 couples signals 186 and 187 together. The signal 187 is supplied to a first input of a NAND circuit 73 which receives at an second input an output 184 of an inverter 70 which receives an OCCRST signal 166. An output signal 188 of the NAND circuit 73 is supplied to an input of an inverter 74 whose output is connected to the signal 187, thus the NADN 73 and inverter 74 constituting a flip-flop configuration.

A transfer gate 75 and 76 couples signals 188 and 189 together. The signal 189 and signal 184 are supplied to inputs of NAND circuit 77, respectively. An output signal 190 of the NAND circuit 77 is supplied to an input of an inverter 78 whose output is connected the signal 189, thus the NAND circuit 77 and inverter 84 constituting a flip-flop configuration.

The signal 190 is supplied to an input of an inverter 79, which output is connected to a signal 186.

The signal 186 is connected in common to the sources of the N-channel MOS transistors71 and P-channel MOS transistor 72 constituting the transfer gate, the gates of an N-channel MOS transistor 81 and P-channel MOS transistor 85, and to an input of an inverter 80.

An output signal 193 of an inverter 80 is supplied to the gates of a P-channel transistor 82 and an N-channel MOS transistor 86.

A transfer gate composed by the N-channel MOS transistor 81 and P-channel MOS transistor 82 couples VCC, which is an internal power supply voltage, to a signal 191. The signal 191 and signal 184 are connected to inputs of a NAND circuit 83, respectively. An output signal 192 of the NAND circuit 83 is inverted by an inverter 84 whose output is connected to the signal 191, with the NAND circuit 83 and inverter 84 constituting a flip-flop configuration.

A transfer gate composed by the N-channel MOS transistor 86 and P-channel MOS transistor 85 couples signals 192 and 194 together. The signal 194 is connected to an input of an inverter 87. An output signal 195 of the inverter 87 is connected to an input of an inverter 88, whose output is connected to the signal 194, with the inverters 87 and 88 constituting a flip-flop configuration.

The signal 195 is connected to a signal 197, via a transfer gate composed by an N-channel MOS transistor 66 and a P-channel MOS transistor 65. The gate of the N-channel MOS transistor 66 is supplied with the TCMP1 signal 152, while the gate of the P-channel MOS transistor 65 is supplied with a signal 179 transmitted via an inverter 52.

A signal 182 is output from a NAND circuit 64 which receives the OCOUTB signal 167 and the TCMP1 signal 152 as inputs. A signal 183 is output from a NAND circuit 89 which receives signals 182 and 197 as inputs.

The TCMP2 signal 153 is supplied to the gates of an N-channel MOS transistor 68 and a P-channel MOS transistor 61. A signal 181, output from an inverter 60, is supplied to the gates of a P-channel MOS transistor 67 and an N-channel MOS transistor 62.

A transfer gate composed by an N-channel MOS transistor 68 and a P-channel MOS transistor 67 couples signals 183 and 173 together, while a transfer gate composed by an N-channel MOS transistor 62 and a P-channel MOS transistor 61 couples a signal 172, as a latch path, to a signal 173. The signal 172 corresponds to the signal 134 in the configuration of FIG. 8. The signal 173 is supplied to an inverter 63 which output a TTRN signal 159.

The TTRN signal 159 is supplied to one of the data-out buffers 39 in FIG. 1. This data-out buffer is assumed here to be a data-out buffer associated with the I/O 3. The TTRN signal is read out to outside via one of I/Os 160. This I/O is assumed here to be the I/O 3.

The on-chip compare latch circuit 33 according to the present embodiment has a circuit configuration in which a circuit adapted to latch a fail bit as from the second fail bit and a test mode for selecting between these circuits is added to an on-chip compare circuit of the configuration of latching the one-bit fail information (see FIG. 8). In the following, the description of the operation same as that of the circuit shown in FIG. 8 is dispensed with and only the operation newly added in the present embodiment will be described with reference to FIGS. 1 to 3.

Figure 3:
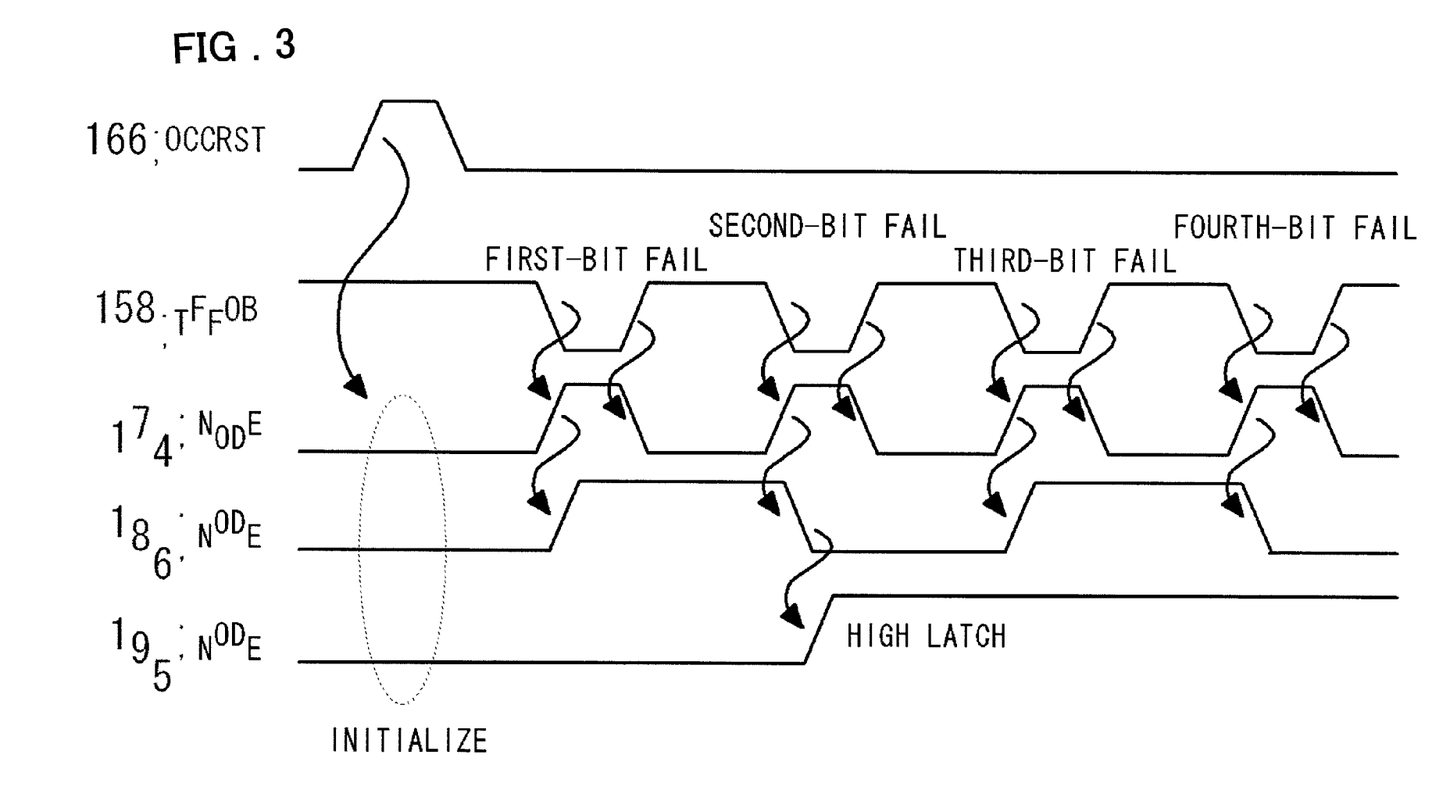
FIG. 3 is a timing chart showing the operation of the on-chip compare latch circuit of the embodiment shown in FIG. 1.

The respective test mode signals are activated by entry of the above-described test mode for initiating a sequence of operations. The respective inner node points are initialized by a one-shot pulse (HIGH level) of the OCCRST signal 166. The N-channel MOS transistor 49 is turned on so that the signal 174 goes LOW. Responsive to the LOW level of the signal 74, the signal 185 goes HIGH via the inverter 69. Thus, the transfer gate (71, 72) is turned on, while the transfer gate (75, 76) is turned off.

With the HIGH level of the OCCRST signal 166, the signal 184 goes LOW via the inverter 70.

Responsive thereto, the output 188 of the NAND circuit 73 goes HIGH, while the output signal 187 of the inverter 74, receiving the output 188, goes LOW.

The output 190 of the NAND circuit 77 goes HIGH, the output signal 189 of the inverter 78 goes LOW and the output signal 186 via inverter 79 goes LOW.

The output 192 of the NAND circuit 83 goes HIGH, while the output signal 191, received by the inverter 84, goes LOW.

Responsive to the LOW level of the signal 186 and HIGH level of the output 193 via the inverter 80, the transfer gate (81, 82) is turned off, while the transfer gate (85, 86) is turned on.

Hence, the signal 194 is connected to the signal 192 and goes HIGH, while the signal 195, via the inverter 87, goes LOW.

If, after the one-shot pulse (HIGH level) of the OCCRST signal 166, the OCCRST signal 166 goes LOW, the gate of the N-channel MOS transistor 49 is in floating state, while the signal 184 via inverter 70 goes HIGH. Thus, the input signal 184 supplied to the input of the NAND circuits 73, 77 and 83 is maintained in the HIGH level.

Then, as the PTEST signal 151 goes HIGH, the TFF0B signal 158, which stands for the result of comparison between the internal read data and the externally supplied expected value, is connected to the signal 168 via the NAND circuit 42. When the PDEBL signal 165 goes HIGH, the transfer gate (44, 45) is turned on, so that the signal 168 is connected to the path which latches and outputs the first LOW level information of the TFF0B signal 158 and to the path which latches the second fail bit in accordance with the present invention.

When the TFF0B signal 158 goes LOW indicating data non-coincidence, the signals 168 and 174 become HIGH, so that the output 185 of the inverter 69 goes LOW. Hence, the transfer gate (75, 76) is turned on, while the transfer gate (71, 72) is turned off, so that the signals 189, 190 and 186 become HIGH, LOW and HIGH, respectively.

Also, responsive to the HIGH level of the signal 186 and to the LOW level of the output 193 of the inverter 80, the transfer gate (81, 82) is turned on, while a transfer gate (85, 86) is turned off, so that the signals 191 and 192 become HIGH and LOW, respectively.

When the TFF0B signal 158 reverts to HIGH, the signals 168 and 174 become LOW, while the output 185 of the inverter 69 becomes HIGH. Thus, the transfer gate (75, 76) is turned off, while the transfer gate (71, 72) is turned on, so that the signals 187 and 188 become HIGH and LOW, respectively.

With the incoming of the second fail bit information, the TFF0B signal 158 goes LOW, while the signals 168 and 174 become HIGH, so that the output 185 of the inverter 169 becomes LOW.

Thus, the transfer gate (75, 76) is turned on, while the transfer gate (71, 72) is turned off, so that the signals 189 and 190 become LOW and HIGH, respectively.

Also, responsive to the LOW of the signal 186 and to the HIGH of the output 193 of the inverter 80, the transfer gate (81, 82) is turned off, while the transfer gate (85, 86) is turned on, so that the signals 194 and 195 become LOW and HIGH, respectively.

The signal 195, which stands for the final latch result, remains unchanged in the HIGH level, no matter how many times the TFF0B signal has toggled.

After termination of an internal latch test sequence, the TCOM1 signal 152 becomes HIGH, by the test mode. The transfer gate (65, 66) is turned on, and the signal 197 becomes the result of the signal 195 which has latched the second LOW level information of the TFF0B signal 158.The TTRN signal 118 is set to the HIGH level.

With the OCOUTB signal 167 then going LOW, the result of the signal 195 is output to the signal line 183 via the NAND 89.

If, in the present embodiment, the TCMP2 signal 153, as test mode signal, is HIGH, the transfer gate (67, 68) is turned on. Hence, the data of the signal 183 as it is becomes the signal 173. This signal is then inverted by the inverter 63 and output as TTRN signal 159.

If the second bit fail information is latched by the signal 195, the TTRN signal 159 goes high. The data of the TTRN signal 159 is read out through the data-out buffer 39 from one of I/Os 160, here I/O3, only as an example.

In case wherein the TCPM1 signal 152 is HIGH and the TCPM1 signal 153 is LOW, the result of latching the first fail bit information is output, as in FIG. 8.

In the present embodiment, a device which may be sorted as a pass device allowing for replacement by antifuses, such as capacitance fuses, may readily be detected by adding a logic to the conventional on-chip comparison test mode.

A further modification of the present invention will now be described. The present modification is directed to a third bit latch circuit as an on-chip compare latch circuit. In the present modification, the latch circuit 200 shown in FIG. 2 is changed in a manner shown in FIG. 4.

Figure 4:
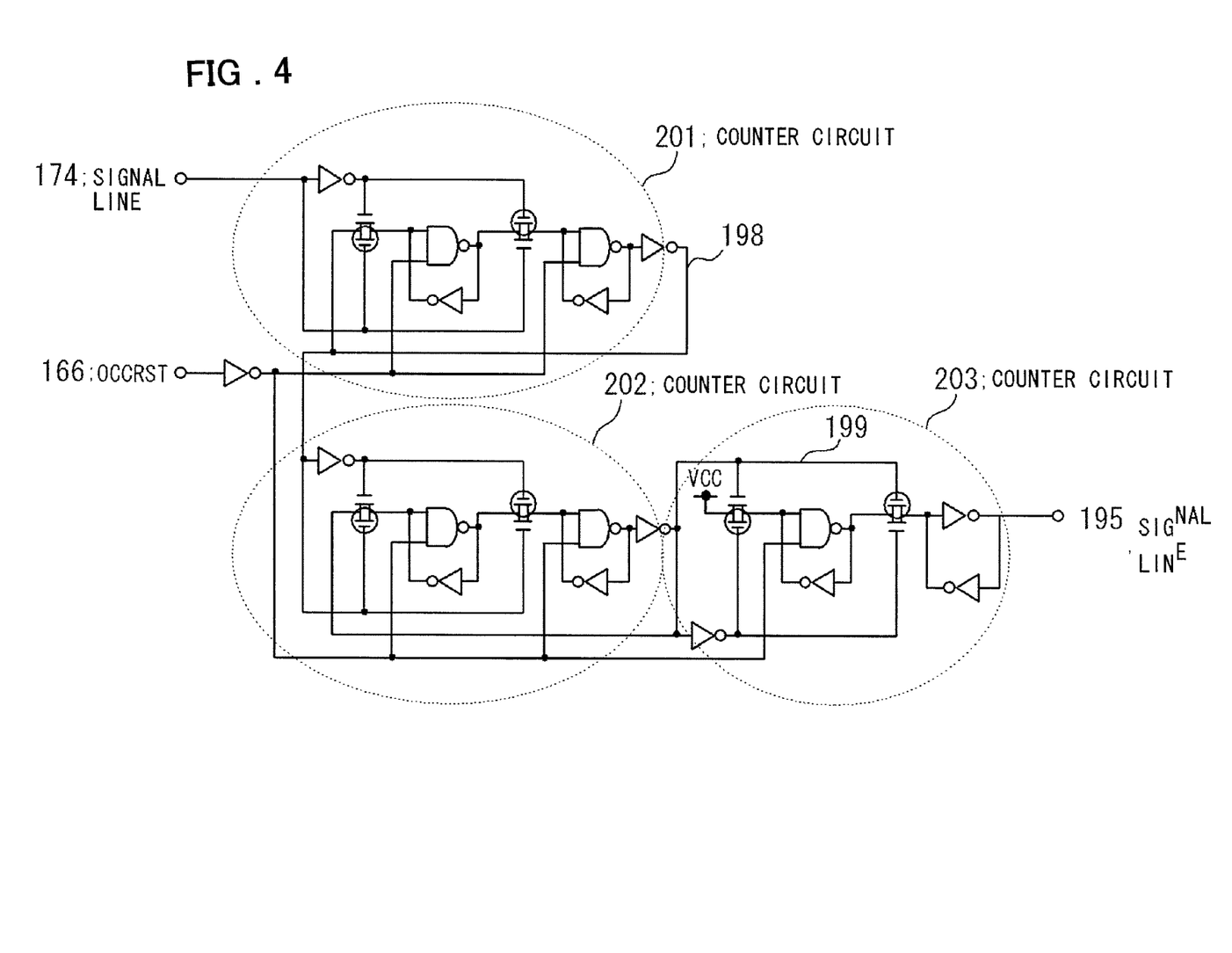
FIG. 4 is a diagram showing the configuration of an on-chip compare latch circuit of a modified embodiment of the present invention.

Referring to FIG. 4, counter circuits 201, 202 and 203 are each equivalent to the latch circuit 200 of FIG. 2. In FIG. 4, a signal line 174 corresponds to the signal line 174 of FIG. 2. The counter circuit 201 corresponds to the latch circuit 200. The counter circuit 202 receives an output signal 198 of the counter circuit 201, while the counter circuit 203 receives an output signal 199 of the counter circuit 202. The output signal 195 of the counter circuit 203 is supplied to the transfer gate (65, 66) of FIG. 2. When the TCMP1 signal 152 is HIGH and the TCMP2 signal 153 is LOW, the third bit fail information is output as the latched result by the TTRN signal 159.

Figure 5:
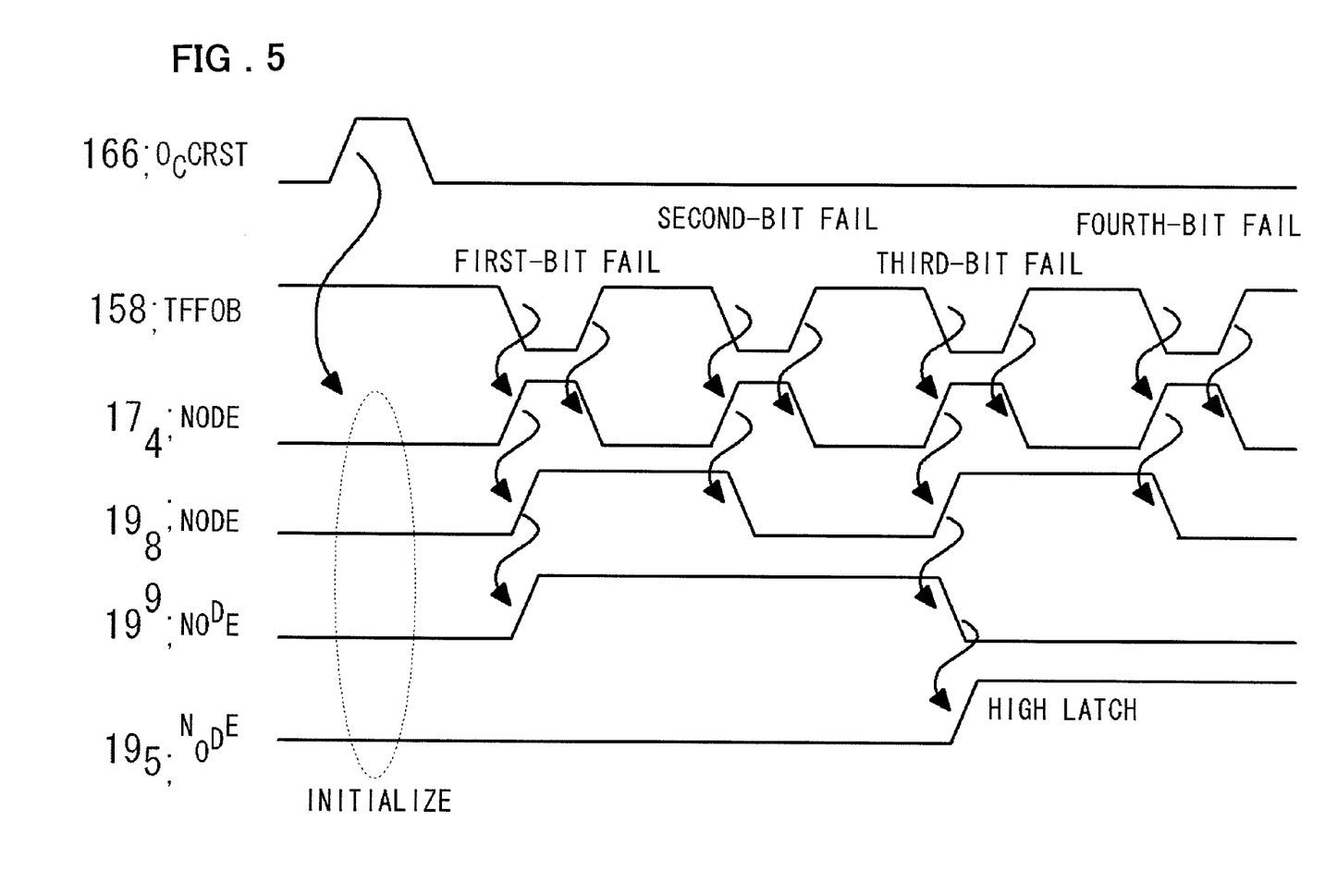
FIG. 5 is a timing chart showing the operation of the on-chip compare latch circuit of the modified embodiment.

FIG. 5 is a timing chart for illustrating the operation of the modified embodiment shown in FIG. 4. Referring to FIG. 5, the third bit fail information of the TFF0B signal 158 is latched by the internal signal 195 and output as the TTRN signal 159. Thus, 3 bit fail bit device may be sorted so that antifuse products, 3 bit of which is replaceable, may readily be extracted.

In similar manner, several bits fail may be latched by correspondingly increasing the number of the counters used. That is, a memory device in which a number of bits which corresponds to the number of the counters used, have failed may be screened to extract an anti-fuse device that allows for swapping fail bits. Although the present invention has so far been explained with reference to the preferred embodiments, the present invention is not limited to the particular configurations of these embodiments. It will be appreciated that the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   a compare circuit, receiving a plurality of read data signals read from a cell array and an input data signal supplied from outside to the semiconductor memory device in association with said read data signals, for comparing said read data signals with said input data signal to each other to output a comparison result signal; and
   a latch circuit, receiving said comparison result signal output from said compare circuit, for outputting the result of latching of a fail bit of a predetermined number succeeding to a first fail bit.

2. The semiconductor memory device according to claim 1, wherein said latch circuit receives a first control signal for controlling the latching of the fail bit information; and wherein in case of said first control signal being in inactive state, said latch circuit outputs the comparison result signal received from said compare circuit, as it is.

3. The semiconductor memory device according to claim 2, wherein said latch circuit includes a circuit, receiving a second control signal, for selecting, whether the first fail bit is to be latched or the N'th fail bit where N is a preset integer not less than 2, is to be latched, based on the value of said second control signal, when said first control signal is in active state.

4. The semiconductor memory device according to claim 2, wherein said latch circuit includes a counter circuit comprising:
   a first latch, receiving the comparison result signal output from said compare circuit, for activating an output thereof responsive to transition of said comparison result signal to a value indicative of fail and for inactivating said output responsive to transition of said comparison result signal to the next fail; and
   a second latch, receiving the output of said first latch, for activating an output thereof responsive to transition of the output of said first latch from the active state to the inactive state;
   an output signal of the counter circuit being output when said first control signal is in an activated state.

5. The semiconductor memory device according to claim 4, wherein said latch circuit includes plural stages of said counter circuits arranged in a cascade connection; and wherein an output signal of the last stage counter circuit is output when said first control signal is in an activated state.

6. The semiconductor memory device according to claim 2, wherein said latch circuit includes:
   a first latch, receiving the comparison result signal output from said compare circuit, for activating an output responsive to transition of said comparison result signal to a value indicative of fail to hold the activated output;
   a counter circuit comprising a second latch and a third latch;
   said second latch, receiving said comparison result signal output from said compare circuit, for activating an output thereof responsive to transition of the received signal to a value indicative of fail and for inactivating the output responsive to transition of said comparison result signal to the next fail;
   said third latch, receiving the output of said second latch, for activating an output thereof responsive to transition of the output of said second latch from the activated state to the inactivated state; and
   a selection circuit for outputting an output of said first latch when said first control signal is in an activated state and said second control signal is in inactivated state,
   outputting an output signal of the counter circuit when said first control signal is in an activated state and said second control signal is in an activated state, and
   outputting the comparison result signal received from said compare circuit as it is, when said first control signal is in inactivated state.

7. The semiconductor memory device according to claim 6, wherein said latch circuit includes plural stages of said counter circuits arranged in a cascade connection; and wherein said selection circuit outputs the output signal of the last stage counter circuit when said first control signal is in an activated state and said second control signal is in an activated state.

8. A semiconductor memory device comprising:
   an on-line compare circuit, receiving data signals read out to a plurality of data buses from a cell array and an data signal supplied thereto from outside, for comparing the signals received as to whether or not the signals received coincide with each other to output said comparison result signal;

an on-line compare latch circuit for latching fail information of a first fail bit responsive to a comparison result signal output from said on-line compare circuit;

said on-line compare latch circuit including:

a circuit for latching a fail bit, as from a preset number fail bit succeeding to a first fail bit, based on a first control signal received; and a circuit for selecting one out of outputting said comparison result signal as it is, outputting the latched result of the first fail bit, and outputting the latched result of the preset number fail bit succeeding to the first fail bit, based on the first control signal and a second control signal received.

9. The semiconductor memory device according to claim 1, including redundant cells and antifuses for writing fail address information to replace a fail cell.

* * * * *